US008592863B2

(12) United States Patent
Rothman et al.

(10) Patent No.: US 8,592,863 B2
(45) Date of Patent: Nov. 26, 2013

(54) PHOTODETECTOR WITH INTERNAL GAIN AND DETECTOR COMPRISING AN ARRAY OF SUCH PHOTODETECTORS

(75) Inventors: Johan Rothman, Lans en Vercors (FR); Jean-Paul Chamonal, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 398 days.

(21) Appl. No.: 12/612,907

(22) Filed: Nov. 5, 2009

(65) Prior Publication Data
US 2010/0117183 A1    May 13, 2010

(30) Foreign Application Priority Data
Nov. 10, 2008    (FR) ...................... 08 57612

(51) Int. Cl.
*H01L 27/144*    (2006.01)
(52) U.S. Cl.
USPC ........... 257/186; 257/448; 257/199; 257/438; 257/481; 257/589
(58) Field of Classification Search
USPC ......... 257/186, 199, 438, 481, 551, 603, 589, 257/E31.063, E31.116, E29.18, E29.307, 257/E29.357, 184; 438/91, 380
See application file for complete search history.

(56) References Cited

U.S. PATENT DOCUMENTS

| 4,481,523 | A | 11/1984 | Osaka et al. |
| 5,059,794 | A | 10/1991 | Takahashi et al. |
| 2008/0067620 | A1 | 3/2008 | Rothman |
| 2009/0218594 | A1* | 9/2009 | Ishimura et al. ............... 257/184 |

FOREIGN PATENT DOCUMENTS

EP    0 553 982 A1    8/1993

* cited by examiner

*Primary Examiner* — Ha Tran T Nguyen
*Assistant Examiner* — Suberr Chi
(74) *Attorney, Agent, or Firm* — Burr & Brown (57) ABSTRACT

A photodetector with internal gain comprising a semiconductor structure in which impact ionization events are produced mostly by minority charge carriers; a first biasing contact and a second biasing contact located in the semiconductor structure; a means of defining, in the semiconductor structure, a photon collection region close to first biasing contact; a P-N type junction formed in the semiconductor structure between the two biasing contacts and close to the second biasing contact; and a collector contact which is located in the P-N junction and used to collect current in the P-N junction.

13 Claims, 4 Drawing Sheets

PHOTODETECTOR WITH INTERNAL GAIN AND DETECTOR COMPRISING AN ARRAY OF SUCH PHOTODETECTORS

BACKGROUND OF THE INVENTION

1. Field of the Invention

The invention relates to the field of photodetectors with internal gain.

2. Description of the Related Art

A photodetector with internal gain is a device which detects electromagnetic radiation and generates an electrical signal, said signal being amplified before it is processed by proximity electronics used to convert, amplify and/or digitize the signal produced by the photodetector.

The internal amplification of the photodetector makes it possible to reduce the amplification of the proximity electronics which is usually a source of noise. In addition, a photodetector with internal gain is currently the only device which is capable of quickly detecting a small number of photons; it is also the only device which allows accurate photon counting.

There are several types of photodetectors with internal gain, in particular photocathode detectors, electron-multiplier charge-coupled devices, avalanche photodiodes and solid-state impact ionization multipliers.

In a photocathode detector, incident radiation generates electrons on a photocathode. The released electrons are then accelerated through an amplifying element. Although they have a good signal-to-noise ratio, photocathode detectors are usually bulky, are limited in terms of their detectable wavelength range (usually less than 1.7 micrometers) and have a low quantum efficiency (generally less than 50%).

Electron-multiplier charge-coupled devices (EMCCDs) detect light in a first CCD array and the charges thus generated are transferred, pixel to pixel, to a second CCD array by applying repetitive voltage pulses. Each charge integrated in a pixel of the first CCD array is thus transferred N times and, by applying a sufficiently high voltage to said array, the transferred charge carriers can be subjected to a so-called "impact ionization" interaction which creates an additional electron-hole pair that produces an amplification gain m. The total amplification gain therefore equals N×m. The quantum efficiency of EMCCD devices is generally high for wavelengths in the visible spectrum but deteriorates rapidly in the near infrared spectrum. In addition, the spectral sensitivity of this type of device is limited by the material which is used for the CCD arrays, this is usually Si which has an energy gap which corresponds to a cut-off wavelength of 0.9 micrometer.

In Avalanche PhotoDiodes (APDs), incident photons generate electron-hole pairs in a semiconductor which has a first type of conductivity. The minority photocarriers are then collected by a highly reverse biased p-n junction. The strong electric field in the p-n junction then generates an impact ionization avalanche which amplifies the signal. APDs are rugged, compact detectors which are relatively insensitive to magnetic fields and have a high quantum efficiency, typically of the order of 90%.

APDs made of Si or of a Group III-V type semiconductor such as diodes made using InGaAs, for example, operate at ambient temperature, but their performance is limited by the presence of impact ionization which is produced by both the electrons and holes. At high gain, there is thus considerable deterioration of the signal-to-noise ratio as well as considerable deterioration of the response time. Avalanche breakdown can also occur; this makes APDs of this type non-linear.

$Cd_xHg_{1-x}Te$-based APDs have a small energy gap which corresponds to cut-off wavelengths of 2.2 to 9 micrometers; they have properties which are close to ideal, thanks to impact ionization being initiated exclusively by a single type of photocarrier, namely electrons. APDs of this type exhibit exponential gain up to very high gains in excess of 5000, even with low bias voltages of tens of volts, as well as a very good signal-to-noise ratio. The excess noise factor (this is the ratio of the increase in the quantum noise of the photodiode in the avalanche regime to the quantum noise of the same photodiode in the non-avalanche regime) is close to 1.

However, $Cd_xHg_{1-x}Te$-based APDs which have a small energy gap must be cooled in order to keep the dark current sufficiently low not to adversely affect their sensitivity.

For larger energy gaps, the performance of $Cd_xHg_{1-x}Te$-based APDs deteriorates and becomes more similar to that of conventional APDs made of Si or a III-V type semiconductor.

What is more, the performance of $Cd_xHg_{1-x}Te$-based APDs which have a small energy gap (less than 0.15 eV) deteriorates significantly due to the high dark current produced by the tunneling effect created by the electric field in the depletion zone.

SUMMARY OF THE INVENTION

The object of the present invention is to propose a photodetector with internal gain which is capable of achieving high gain amplification at low bias voltages and which has a good signal-to-noise ratio, a low response time and a low tunneling current over a wide range of detected wavelengths up to 20 micrometers.

To achieve this, the object of the invention is a photodetector with internal gain comprising:
- a semiconductor structure in which impact ionization events are produced mostly by minority charge carriers;
- a first biasing contact and a second biasing contact located in the semiconductor structure;
- a means of defining, in the semiconductor structure, a photon collection region close to the first biasing contact;
- a P-N type junction formed in the semiconductor structure between the two biasing contacts and close to the second biasing contact; and
- a collector contact which is located in the P-N junction and used to collect current in the P-N junction.

The term "close to" is taken to mean, according to the invention, that the photon collection region is closer to the first biasing contact than to the second biasing contact and that the P-N junction is closer to the second biasing contact than to the first biasing contact.

A conventional APD usually comprises at least two semiconductor layers of opposite conductivity types which form a P-N junction. When this junction is reverse biased, a depletion zone forms in the least doped layer; typically, this is the first semiconductor layer. When minority charge carriers are present, this creates an impact ionization avalanche, thereby amplifying the signal.

According to the invention, the first semiconductor layer of the APD is modified so as to produce pre-amplification due to carrier impact ionization in this layer when it is subjected to an electric field by using the first and second biasing contacts. More especially, a drift zone is formed in the first semiconductor layer of the APD. The first function of the P-N junction which is subjected to its own voltage via the collector contact is thus to collect the charge carriers formed in the semiconductor structure. If applicable, when the P-N junction is also subjected to high reverse bias, the latter also produces avalanche amplification as described above.

The amplification of the P-N junction is then performed on the charge carriers created in the semiconductor structure which are more numerous than the charge carriers created directly by bombardment by photons because of the pre-amplification.

The coupling between the semiconductor structure and the APD thus makes it possible to achieve gains equal to at least the square of the gain of an APD on its own. In addition, the tunneling current in the semiconductor structure is reduced compared with an APD having identical gain because, in particular, of the weaker electric field which is used to obtain this gain.

Moreover, the pre-amplification in the semiconductor structure reduces the sensitivity of the photoconductor to the generation of a dark current in the APD. The APD can therefore be used with higher gain than conventional APDs without any deterioration in the signal-to-noise ratio.

Finally, achieving high gain through this coupling also allows detection in wavelengths from 10 to 20 micrometers thanks to the reduced dark current. Because the local electric field is actually weaker, the dark current associated with the tunneling effect is reduced.

According to one particular embodiment of the invention, the semiconductor structure comprises a first semiconductor layer of a first type of conductivity and the P-N junction is formed at the interface with a semiconductor region of a second type of conductivity located in the first semiconductor layer.

In other words, the semiconductor structure forms a horizontal structure and the P-N junction forms a structure which is substantially transversal relative to the semiconductor structure such as, for instance, a three-dimensional geometry having a shape which falls somewhere between a hemisphere and a cylinder.

More especially, the semiconductor structure also comprises a second semiconductor layer inserted into the first semiconductor layer at the level of the semiconductor region of the P-N junction with the second semiconductor layer having a band gap (or energy gap) which is smaller than that of the first layer. In particular, the second semiconductor layer has the same type of conductivity as the first semiconductor layer or the opposite type of conductivity with less doping than that of the first semiconductor layer.

In other words, the minority charge carriers generated in the first semiconductor layer by the incident photons will be diffused and confined in the second semiconductor layer. The gain thus obtained through pre-amplification in the semiconductor structure and in the P-N junction is therefore comparable to that obtained in a homogeneous structure having a band gap equal to that of the second semiconductor layer. In addition, the dark current generated during the drift of charge carriers in the semiconductor structure and in the P-N junction is reduced compared with that in a homogeneous structure having a band gap equal to that of the second semiconductor layer, thanks to the reduced volume of that layer. This embodiment makes it possible to reduce the bias voltages used to obtain sufficient gain in a detector built to detect photons having a short wavelength of 0.4 to 5 micrometers by minimizing the increase in the dark current associated with a lower Cd composition.

According to one particular embodiment of the invention, the semiconductor structure comprises a second semiconductor layer of a first type of conductivity located in the first semiconductor layer with the second layer having a band gap which is larger than that of the first semiconductor layer.

In other words, the P-N junction which is formed in the semiconductor layer having the larger band gap, requires an increased reverse bias voltage in order to collect the minority charge carriers formed in the semiconductor layer having the smaller band gap, thus forming a switchable diode. The minority charge carriers will therefore not be collected by the weakly biased P-N junction. The instant at which the charge carriers are collected via the P-N junction can be accurately selected by increasing the bias voltage. This embodiment is especially suitable for producing detector arrays for imaging purposes.

According to one particular embodiment of the invention (with a switchable p-n junction), the semiconductor structure comprises a first semiconductor layer of a first type of conductivity and the P-N junction is a mesa-type structure located above the first semi-conductor layer.

The mesa structure comprises, in a known manner, a stack of semiconductor layers. This makes it possible to toggle the P-N junction between a blind state and a collection state.

According to one particular embodiment of the invention, the means of defining the photon collection region comprises an opaque sheet located on or underneath the semiconductor structure and having an opening, especially an opaque sheet formed in a single block with first biasing contact.

According to one particular embodiment of the invention, the means of defining the photon collection region comprises a convergent micro lens located on or underneath the semi-conductor structure.

According to one particular embodiment of the invention, a P-N junction having a mesa type structure is located opposite the photon collection region of the semiconductor structure and this makes it possible to reset the number of charge carriers that are present in the semiconductor structure before starting a new photon collection and amplification operation.

According to one particular embodiment of the invention, the semiconductor structure comprises a P-type $Cd_xHg_{1-x}Te$ alloy which has a stoichiometric Cd composition of less than 60%.

The object of the invention is also a detector which comprises an array of photoconductors of the above-mentioned type.

According to one particular embodiment of the detector, two contiguous photodetectors on a row are positioned head-to-foot with their local biasing contacts close to the photon collection region being common to both photodetectors, this makes it possible to save space and simplifies the design in particular.

The object of the invention is also a detector comprising:
a semiconductor structure in which impact ionization events are produced mostly by minority charge carriers;
a first biasing contact and a second biasing contact located in the semiconductor structure along two opposite edges of the structure;
a means of defining, in the semiconductor structure, a photon collection region close to the first biasing contact;
a first array of P-N type junctions formed in the semiconductor structure between the two biasing contacts;
a second array of P-N type junctions forming mesa type structures; and
means of defining photon collection regions underneath each P-N type junction of the first array.

BRIEF DESCRIPTION OF THE DRAWINGS

The invention will be made more readily understandable by the following description which is given merely by way of example and relates to the accompanying drawings in which identical references denote identical or analogous components and in which.

DETAILED DESCRIPTION OF THE INVENTION

Figure 1:
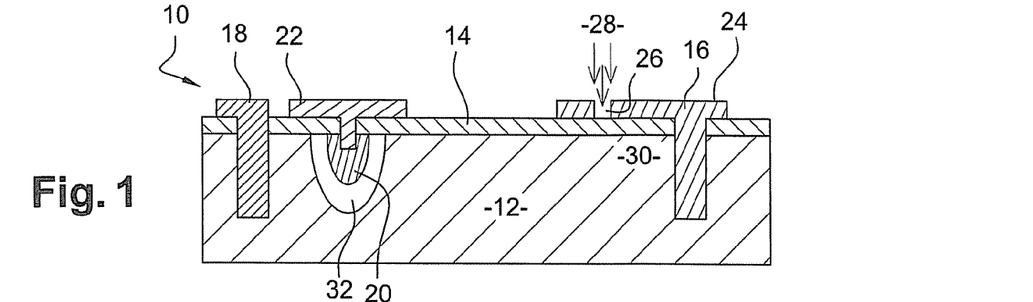
FIGS. 1 and 2 are schematic cross-sectional and top views respectively of a first embodiment of the photodetector with internal gain according to the invention.
Figure 2:
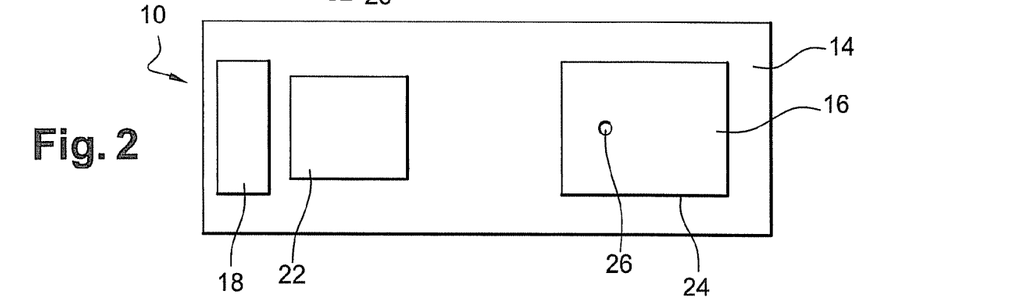

FIGS. 1 and 2 are schematic views of a photodetector with internal gain 10 in accordance with a first embodiment.

Photodetector 10 comprises semiconductor layer 12 of a first conductivity type, for example P-type conductivity, and a passivation layer 14, made of zinc sulfide (ZnS) for instance, which covers layer 12 and protects it against chemical, mechanical and electrical damage. Two metallic (preferably ohmic) contacts 16, 18, such as gold, for example, are also provided in layer 12; they pass through passivation layer 14 and emerge on the surface of the passivation layer.

Layer 12 is made of a semiconductor material doped with nearby majority charge carriers which do not produce impact ionization events. Thus, when this layer is subjected to an electric field, only the minority charge carriers—electrons in the case of P-type conductivity—produce impact ionization events. A $Cd_xHg_{1-x}Te$ alloy with a stoichiometric Cd composition of less than 60% (x<0.6) makes it possible to obtain this characteristic.

A region 20 of conductivity opposite to that of semiconductor layer 12, consisting of a Group III material such as boron for example, is located in the semiconductor layer between the two biasing contacts 16 and 18, and a metallic collector contact 22 is located in region 20 extending through passivation layer 14.

One of the biasing contacts, for example contact 16, forms, on the surface of passivation layer 14, an opaque sheet 24 provided with an opening 26 designed to let incident electromagnetic radiation (photons) 28 through, thus defining, in semiconductor layer 12, a photon collection region 30 close to contact 16. Defining a precise photon collection region also makes it possible to reduce the generated parasitic photocurrent which would otherwise be produced in other areas of layer 12. Region 20 is formed close to the other biasing contact 18.

In a continuous operating mode, a continuous potential difference is applied between biasing contacts 16 and 18 and this creates an electric field "$E_1$". The incident photons on sheet 24 then create charge carriers in region 30. In the presence of electric field "$E_1$", the minority charge carriers migrate towards contact 18 and, during this migration, produce impact ionization events which multiply their number; this number becomes larger the greater the length of the semiconductor layer between the two biasing contacts 16 and 18.

Also, the P-N junction, formed by the combination of region 20 and semiconductor layer 12, is subjected to a high reverse voltage by applying an appropriate voltage to collector contact 22 so that a depletion zone 32, characterized by a strong magnetic field, is created in the less doped semiconductor, for example layer 12. Avalanche amplification is thus obtained due to the P-N junction behaving like an APD. Depletion zone 32 is preferably stabilized in a low-doped area which can be formed when region 20 is produced. Forming this low-doped area makes it possible to stabilize the gain of the APD. In fact, the gain of an APD depends on the width of its junction. In the presence of a low-doped area, the depletion zone remains essentially in this zone and this has the effect making gain insensitive to doping. This gain is therefore reproducible and the dark current is weaker. For example, this zone is obtained by implanting a Group III element in the CdHgTe semiconductor with P-type doping.

The size of the P-N junction which forms the diode for collecting the minority charge carriers is less than 10 micrometers in diameter and the length of the minority charge carrier drift zone, i.e. the spacing between photon collection region 30 and the P-N junction is 10 micrometers to 1 millimeter.

The distance between the P-N junction and biasing contact 18 is short compared with the length of the drift zone and is, for instance, 5 to 20 micrometers. Similarly, the distance between the photon collection region and contact 16 is short compared with the length of the drift zone and is, for instance, 1 to 20 micrometers. Also, the diameter of photon collection region 30 is small compared with the length of the drift zone and is, for instance, 1 to 20 micrometers.

The total gain of photodetector 10 therefore equals $M_{total}=M_D \times M_{APD} \times \eta_{coll}$ where:

$M_D$ is the pre-amplification gain obtained in layer 12, $M_{APD}$ is the gain obtained in the P-N junction, and $\eta_{coll}$ is the efficiency with which the P-N junction collects the minority charge carriers.

Gain in excess of $2.5 \times 10^7$ is thus obtained in detectors having a cut-off length close to 5 micrometers at an operating temperature of T=77K.

Thanks to the layout described above, it is possible to obtain a current of 1.2 mA for the detection of a single incident photon in region 30, assuming a moderate collection efficiency $\eta_{coll}$ of 50%, a response time of the order of 100 ps and a gain of $M_{tot}=2 \times 10^6$, thus achieving a voltage of the order of 64 mV on the input of proximity electronics having an input impedance of 50 ohms. This signal can be measured directly on a high-speed oscilloscope.

Note that, depending on the reverse voltage applied to the P-N junction via collector contact 22, the P-N junction can be used either in passive mode, in which case signal amplification is essentially performed in layer 12 because no avalanche effect occurs, or in avalanche mode with additional gain $M_{APD}$.

In a so-called integration operating mode, the voltage, and therefore the electric field, between biasing contacts 16, 18 is initially zero. Incident photons in region 30 of semiconductor layer 12 thus produce a concentration of charge carriers in this region and this concentration spreads through diffusion. After this initial stage, a voltage is then applied between contacts 16, 18, thereby producing an electric field in layer 12. The charge carriers then drift towards the P-N junction which is reverse biased and this produces impact ionization events. This operating mode is therefore especially suitable for imaging using a detector array.

Figure 3:
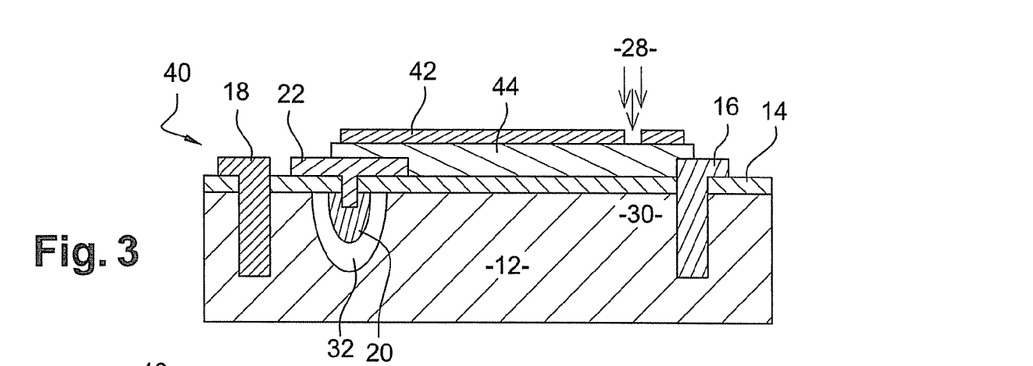
FIGS. 3 and 4 are schematic cross-sectional and top views respectively of a second embodiment of the photodetector with internal gain according to the invention.
Figure 4:
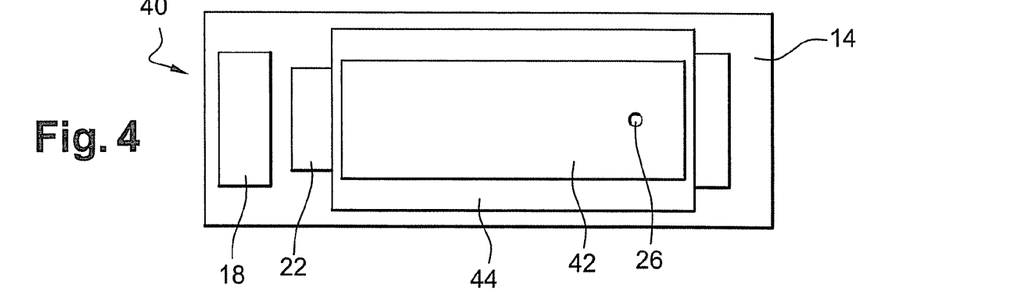

FIGS. 3 and 4 schematically show a second embodiment of the invention. In contrast to photodetector 10 described above, in photodetector 40 according to the second embodiment, metallic sheet 24 is replaced by opaque metallization 42, made of gold (Au) for example, deposited on passivation (for instance) layer 44 made of zinc sulfide (ZnS), or of an insulating material which is itself deposited on passivation layer 14 and, at least partially, on contacts 16 and 22. Opaque metallization 42 thus extends substantially between these two contacts 16, 22, i.e. between photon collection region 30 and the P-N junction for collecting the minority charge carriers formed in layer 12. Better screening to block stray photons is obtained in this way. In addition, the surface area of biasing contact 16 is reduced, thus reducing any disruption of the transport of minority charge carriers.

Figure 5:
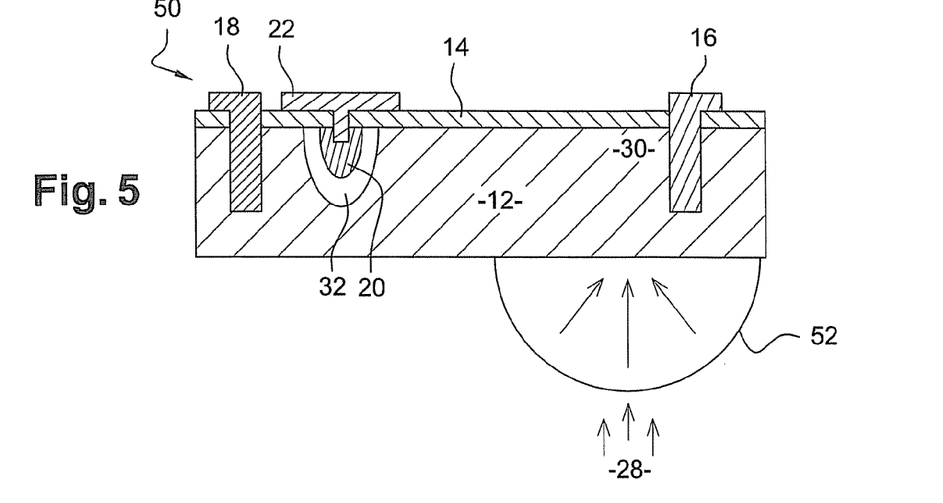
FIG. 5 is a schematic cross-sectional view of a fourth embodiment of the photodetector with internal gain according to the invention.

FIG. 5 is a schematic cross-sectional view of a third embodiment in which photodetector 50 is illuminated from the rear by electromagnetic radiation 28 and is provided with a micro lens 52 which focuses radiation 28 onto photon collection region 30. The surface area of biasing contact 16 is also reduced, for the reasons stated earlier. Note that the lens is positioned on the back face of layer 12, preferably opposite contact 16. This positioning makes it possible to concentrate the absorption of light in the vicinity of contact 16.

Figure 6:
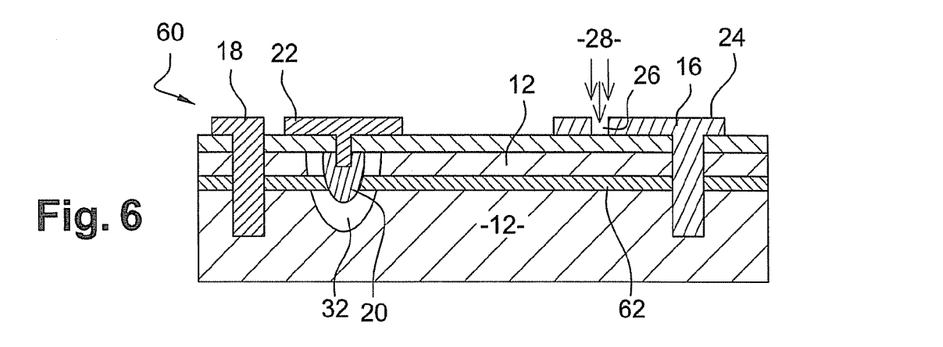
FIG. 6 is a schematic cross-sectional view of a fifth embodiment of the photodetector with internal gain according to the invention.

FIG. 6 schematically shows a cross-sectional view of a fourth embodiment of the invention. This embodiment differs from the preceding embodiments in that semiconductor layer 62 is inserted into semiconductor layer 12 at the level of region 20 of the P-N junction. This layer 62 is either of the same type of conductivity as layer 12, for example p-type conductivity, or of an opposite conductivity type with less doping and has a band gap which is smaller than that of layer 12. This way, the minority charge carriers generated by incident photons in region 30 of layer 12 diffuse and are confined in layer 62. Semiconductor layer 62 preferably consists of $Cd_xHg_{1-x}Te$ with a lower x composition than the x composition of layer 12. For example:

for layer 12: x is 0.3 to 0.8 and P-type doping is performed using an arsenic (As) concentration of $10^{15}$ to $10^{17}$ cm$^{-3}$; and for layer 62: x is 0.15 to 0.4 and N-type doping is performed using an indium (In) concentration of $10^{14}$ to $10^{15}$ cm$^{-3}$ Thus, the gain obtained by drifting of the minority charge carriers towards region 20 is, due to the avalanche effect in the P-N junction, comparable with that of a homogeneous structure, i.e. one consisting of a single semiconductor layer with a band gap equal to that of layer 62. Also, the dark current is reduced. The thickness of layer 62 is preferably less than that of layer 12. Thus, the dark current generated during the drift of charge carriers in the semiconductor structure and in the P-N junction is reduced compared to that in a homogeneous structure having a band gap equal to that of the second semiconductor layer, thanks to the reduced volume of that layer. This embodiment makes it possible to reduce the bias voltages used to obtain sufficient gain in a detector built to detect photons having a short wavelength of 0.4-5 micrometers by minimizing the increase in the dark current associated with a lower Cd composition.

Figure 7:
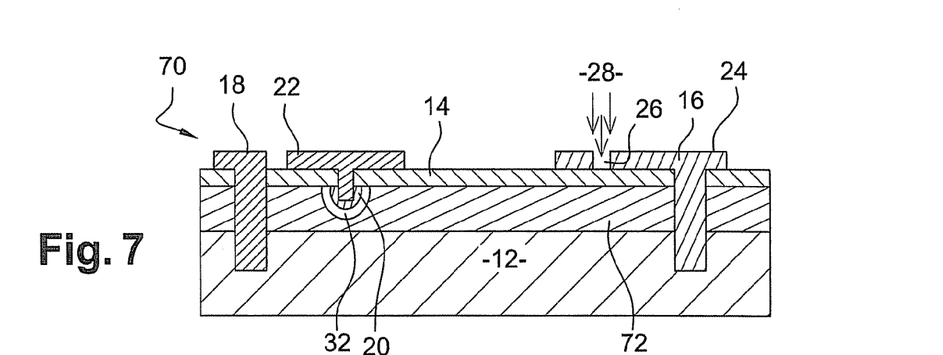
FIG. 7 is a schematic cross-sectional view of a sixth embodiment of the photodetector with internal gain according to the invention.

FIG. 7 schematically shows a cross-sectional view of a fifth embodiment of the invention. This embodiment differs from the embodiments in FIGS. 1 to 5 in that semiconductor layer 72 having the same type of conductivity as layer 12, but with a larger band gap than that of layer 12, is inserted between the latter and passivation layer 14. Layer 72 is also sufficiently thick for depletion zone 32 to be formed entirely within this layer with a low reverse bias value and through this layer for higher reverse bias values. The thickness of layer 72 depends on the type of doping and is preferably 0.5 μm to 1 μm more than the depth of region 20. Layer 72 preferably consists of $Cd_xHg_{1-x}Te$ with a higher x composition than the x composition of layer 12. For example, layer 12 has an x composition of 0.15 to 0.4, preferably an x composition equal to 0.3 and layer 72 has an x composition of 0.2 to 0.5, preferably an x composition equal to 0.35.

Note that zone 32 only extends into layer 12 with high reverse bias. Region 20 is always bounded by layer 72.

The P-N junction is thus formed by a combination of region 20 and layer 72. Because layer 72 has a larger band gap, it is therefore necessary to apply a higher reverse bias voltage to the P-N junction in order to collect the minority charge carriers. Because the reverse bias is higher, it is then easier to choose the instant at which to collect the charges underneath the P-N junction.

Note that, apart from the semiconductor structure which forms region 20 with the P-N junction, the embodiments in FIGS. 6 and 7 repeat the same layout as the embodiments in FIGS. 1 and 2. Obviously, inserting semiconductor layer 62 into semiconductor layer 12 and stacking semiconductor layers 12 and 72 is equally applicable to the embodiments shown in FIGS. 3 to 5.

Figure 8:
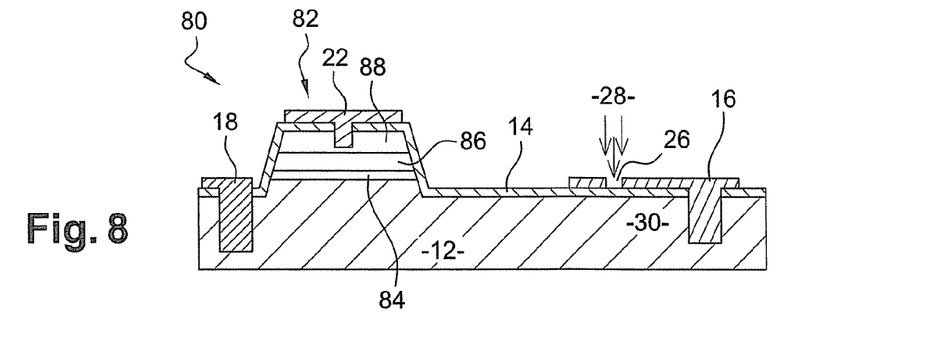
FIG. 8 is a schematic cross-sectional view of a seventh embodiment of the photodetector with internal gain according to the invention.

FIG. 8 schematically shows a cross-sectional view of a sixth embodiment of the invention. According to this embodiment, the P-N junction forming a diode in the preceding embodiments is replaced by a P-N junction forming a diode having a structure 82 referred to as a "mesa" (Spanish word for "table" which means micro-pillar). Mesa structure 82 comprises a first layer 84 formed on semiconductor layer 12 of the same type of conductivity and with the same band gap as the latter, but with less doping. A second semiconductor layer 86 is deposited on layer 84 and has the same conductivity and same doping as layer 84, but with a larger band gap. A third semiconductor layer 88 deposited on layer 86 completes mesa structure 82, this third layer 88 has a conductivity type opposite to that of layer 86 and a band gap which is identical to the latter. Passivation layer 14 then covers layer 88 and collector contact 22 is located in the latter. Layers 84, 86 and 88 consist of $Cd_xHg_{1-x}Te$ with Cd compositions which make it possible to realize the variation in the band gap described below. For example:

for layer 84: x=0.3 and P-type doping is performed using an arsenic concentration of $10^{15}$ to $5.10^{15}$ cm$^{-3}$;

for layer 86: x=0.35 and P-type doping is performed using an arsenic concentration of $10^{15}$ to $5.10^{15}$ cm$^{-3}$; and for layer 88: x=0.35 and N-type doping is performed using an indium concentration of $10^{17}$ cm$^{-3}$.

Using such a mesa diode structure makes it possible to obtain a switchable diode which can be used to choose the instant at which charge carriers are collected, as in the fifth embodiment. The mesa embodiment can provide better control of the switching bias (because it can be designed by choosing the doping and thickness of the various layers) and hence more reliable, less variable switching.

Figure 9:
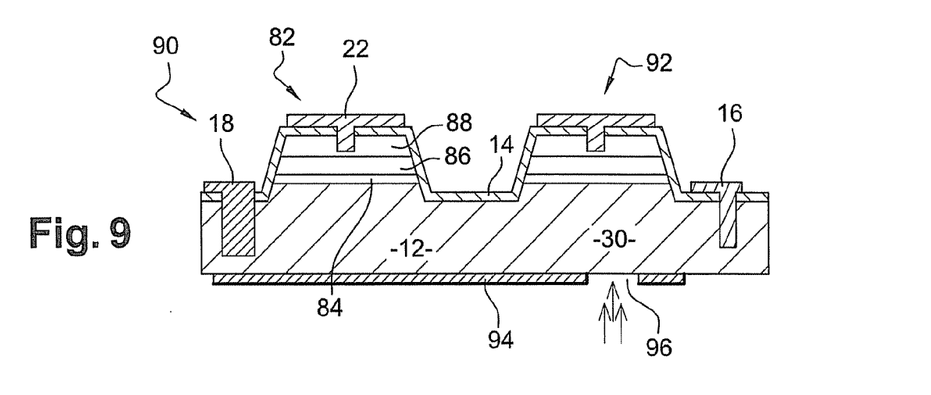
FIG. 9 is a schematic cross-sectional view of an eighth embodiment of the photodetector with internal gain according to the invention.

In FIG. 9, photoconductor 90 according to a seventh embodiment of the invention differs from the embodiment in FIG. 8 in that a diode with a mesa structure 92, identical to mesa structure 82, is located above photon collection region 30. Here, collection region 30 is defined by opaque metallic sheet 94 provided with an opening and separately mounted on the back face of semiconductor layer 12. This sheet is, for example, made of gold (Au) and is 200 nm thick. The role of opaque sheet 94 and the opening is to define the location through which the photons pass, while preventing generation elsewhere.

Thus, when the diode with mesa structure 92 is reversed biased, it collects the minority charge carriers in region 30. In the "integration" operating mode, this therefore makes it possible to reset the number of charge carriers present in photoconductor 90 before starting a new integration cycle.

Obviously, a diode with a mesa structure 92 is applicable to all the embodiments described above, subject to modifications which are within the grasp of those skilled in the art.

Figure 10:
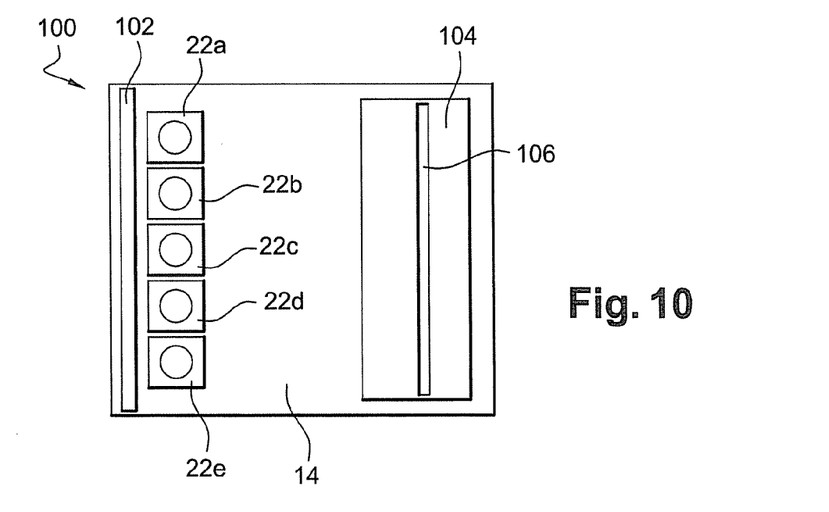
FIG. 10 is a schematic top view of a strip of photodetectors with internal gain according to the invention.

FIG. 10 schematically shows a top view of strip 100 of photodetectors according to the first embodiment in FIGS. 1 and 2, in this case a strip of five photodetectors. Advantageously, rather than placing separate photodetectors side by side in order to form strip 100, biasing contacts 102, 104 are common to all the photodetectors. In the example shown here, slot 106 formed in biasing contact 104 is used to define a continuous photon collection region in the semiconductor structure formed underneath passivation layer 14. Only the P-N junctions whose collector contacts 22a-22e are visible are separate here in order to form the pixels of strip 100. This ensures more compactness and simpler fabrication.

Strip 100 can thus be used in pushbroom type spectroscopy or imaging applications.

Although strip 100 shown here is based on the embodiment shown in FIGS. 1 and 2, it is evident that it can consist of photodetectors produced according to other embodiments which have common biasing contacts. The photon collection region can thus be defined by external optics, micro lenses mounted on the strip, plasmon antennas and/or metallization mounted on the front or back face of the strip.

Figure 11:
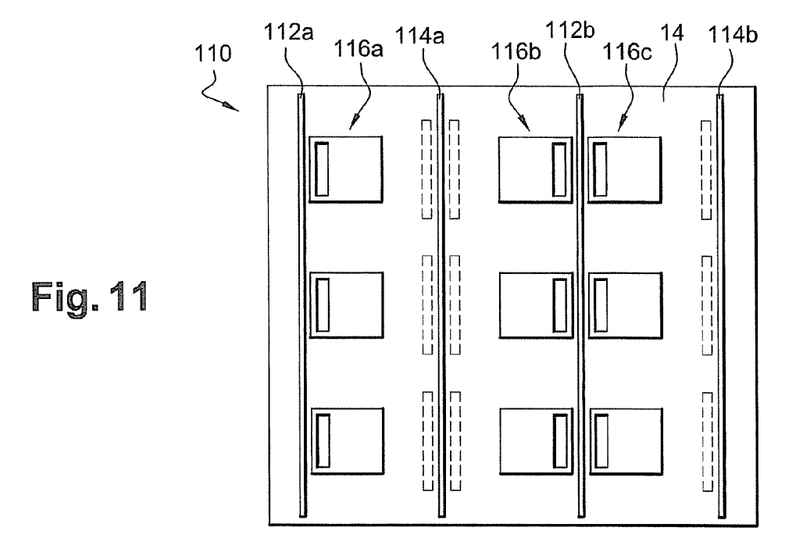
FIGS. 11 and 12 are schematic cross-sectional and top views respectively of a first embodiment of an array of photodetectors with internal gain according to the invention.
Figure 12:
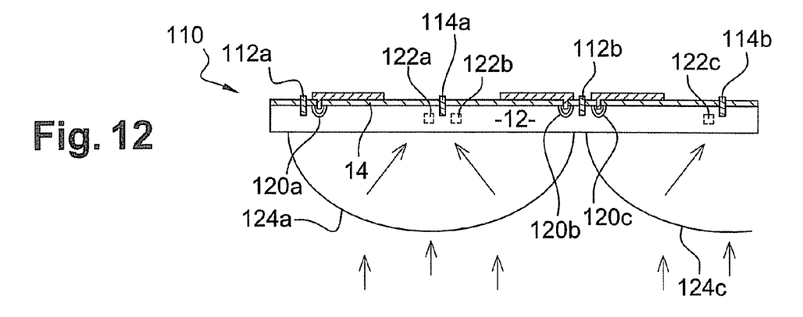

FIGS. 11 and 12 show a schematic top and cross-sectional view respectively of an array 110 of photodetectors which is part of a detector array, in this case an array of 3*3 photodetectors.

Array 110 comprises semiconductor layer 12 covered by passivation layer 14 as described earlier. Metallic biasing contacts 112a, 112b, 114a, 114b are formed in semiconductor layer 12 through passivation layer 14, and columns 116a, 116b, 116c of P-N junctions are formed between each pair of adjacent metal contacts 112a, 112b, 114a, 114b.

In order to maximize gain, semiconductor regions 120a, 120b, 120c of conductivity type opposite to that of the layer 12 and which form, together with the latter, the P-N junctions are located very close to metallic contacts 112a, 112b. Similarly, photon collection regions 122a, 122b, 122c are defined close to metallic contacts 114a, 114b by means of semi-cylindrical micro lenses 124a, 124b which are separately mounted on the back face of array 110 and centered on contacts 114a, 114b.

The photon collection region can thus be defined by other external optics such as micro lenses, plasmon antennas and/or metallization mounted on the front or back face.

Combining two adjacent biasing contacts and one P-N junction thus defines a photodetector according to the invention with two adjacent photodetectors on one row of array 110 being arranged head to toe, i.e. their P-N junctions and their photon collection regions are inverted. Three adjacent biasing contacts are then used to create an electric field in two adjacent photodetectors on one row.

Array 110 therefore makes it possible to collect the charge carriers produced by incident photons throughout the period when bias voltage is applied to biasing contacts 112a, 112b, 114a, 114b. In addition, the signals generated by the P-N junctions can be integrated by means of a readout circuit which is hybridized on them.

Obviously, P-N junctions which form a mesa-type diode can be used. Similarly, diodes with a mesa structure can also be used to reset the minority charge carriers in each photon collection region, as described above. In this case, the photons impinge on the back face of array 110.

Figure 13:
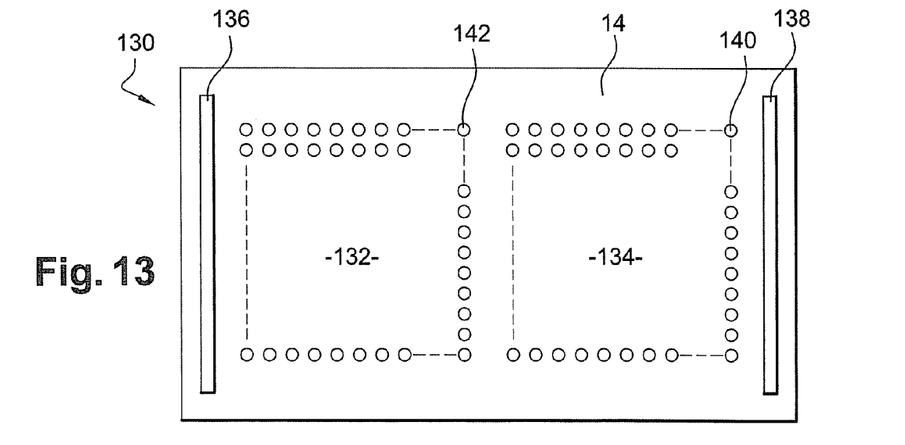
FIG. 13 is a schematic top view of a second embodiment of an array of photodetectors with internal gain according to the invention.

FIG. 13 is a schematic top view of another embodiment of a detector array 130 in accordance with the invention.

According to this embodiment, detector 130 comprises two arrays 132, 134 of P-N junctions that form diodes with a mesa structure which are formed in a similar manner to the embodiments described in FIGS. 8 and 9.

Two biasing contacts 136, 138 are also provided either side of detector 130 in order to create an electric field in arrays 132, 134. The photon collection regions are defined underneath every mesa-structure diode of array 134, for example by using micro lenses mounted on the back face of detector 130.

After resetting the number of minority charge carriers under every mesa diode in array 134, the back face of the array is exposed for a period which is shorter than the minority charge-carrier lifetime. A voltage is then applied to contacts 136, 138, thereby creating an electric field in the detector. The minority charge carriers are then amplified and transferred under array of mesa diodes 132 and are collected by the latter.

The time for which voltage is applied to contacts 136, 138 is adjusted to ensure reproducible transfer of the minority charge carriers produced by incident photons under a mesa diode of array 134 to a mesa diode of array 132. The diodes in arrays 132 and 134 are thus paired, diode 140 of array 134 being paired, for example, with diode 142 of array 132. Because the spacing between the paired diodes of the two arrays and the drift velocity of the minority charge carriers as a function of the electric field are known, the voltage across the biasing contacts and the time for which this voltage is applied are also known.

The invention claimed is:

1. A photodetector with internal gain comprising:
    a semiconductor layer having a thickness and formed along a main plane and made of a P-type $Cd_xHg_{1-x}Te$ alloy having a stoichiometric Cd composition of less than 60% so that impact ionization events are produced only by minority charge carriers in the semiconductor layer;
    a first biasing contact and a second biasing contact that both penetrate and are located in the semiconductor layer, wherein the first and second biasing contacts extend along parallel planes that are perpendicular to the main plane of the semiconductor layer and are separated along the main plane of the semiconductor layer;
    a photon collection region formed in the thickness of the semiconductor layer adjacent to the first biasing contact;
    a P-N junction formed in the semiconductor layer adjacent to the second biasing contact, wherein the photon collection region and the P-N junction are respectively located along said parallel planes of the first and second biasing contacts in the semiconductor layer and are separated by a distance alone the main plane of the the semiconductor layer; and
    a collector contact which is located in the P-N junction and used to collect current in the P-N junction.

2. A photodetector as claimed in claim 1, wherein the semiconductor layer comprises a first semiconductor layer of a first conductivity type with the P-N junction comprising a semiconductor region of a second conductivity type located in the first semiconductor layer.

3. A photodetector as claimed in claim 2, wherein the semiconductor layer also comprises a second semiconductor layer inserted into the first semiconductor layer at the level of the semiconductor region of P-N junction, with the second semiconductor layer having a band gap which is smaller than that of the first layer.

4. A photodetector as claimed in claim 3, wherein the second semiconductor layer has the same type of conductivity as the first semiconductor layer or the opposite type of conductivity with less doping than that of the first semiconductor layer.

5. A photodetector as claimed in claim 2, wherein the semiconductor layer comprises a second semiconductor layer of a first conductivity type located on the first semiconductor layer with the second layer having a band gap which is larger than that of first semiconductor layer.

6. A photodetector as claimed in claim 1, wherein the semiconductor layer comprises a first semiconductor layer of a first conductivity type with the P-N junction being a mesa type structure located above the first semiconductor layer.

7. A photodetector as claimed in claim 6, wherein the semiconductor layer comprises a second semiconductor layer of a first conductivity type located on the first semiconductor layer with the second layer having a band gap which is larger than that of first semiconductor layer.

8. A photodetector as claimed in claim 1, wherein the photon collection region comprises an opaque sheet located on or underneath the semiconductor layer and having an opening in the opaque sheet formed in a single block of the first biasing contact.

9. A photodetector as claimed in claim 1, wherein the photon collection region comprises a convergent micro lens located on or underneath the semiconductor layer.

10. A photodetector as claimed in claim 1, wherein a P-N junction with a mesa type structure is located opposite the photon collection region of semiconductor layer.

11. A detector comprising an array of photodetectors according to claim 1.

12. A detector as claimed in claim 11, wherein two contiguous photodetectors on one row are arranged head to toe with their biasing contacts located close to the photon collection regions being common.

13. A detector comprising:
a semiconductor layer having a thickness and formed along a main plane and made of a P-type $Cd_xHg_{1-x}Te$ alloy having stoichiometric Cd composition of less than 60% so that impact ionization events are produced only by minority charge carriers in the semiconductor layer;
a first biasing contact and a second biasing contact that both penetrate and are located in the semiconductor layer along two opposite ends of the semiconductor layer, wherein first and second biasing contacts extend along parallel planes that are perpendicular to the main plane of the semiconductor layer and are separated along the main plane of the semiconductor layer;
a photon collection region formed in the semiconductor layer adjacent to the first biasing contact;
a first array of photon collection regions arranged in rows and columns;
a second array of P-N junctions forming mesa type structures and having the same number of rows and columns as the first array of photon collection regions; and
a P-N junction above each photon collection region of the first array,
wherein a row of the first array of photon collection regions and a row of the second array of P-N junctions are stacked along a plane perpendicular to the main plane of the semiconductor layer between the first and second biasing contacts.

* * * * *